United States Patent
Ju et al.

(10) Patent No.: US 9,505,914 B2
(45) Date of Patent: Nov. 29, 2016

(54) INORGANIC FILLER, RESIN COMPOSITION COMPRISING THE SAME AND HEAT RADIATION SUBSTRATE USING THE SAME

(71) Applicant: LG INNOTEK CO., LTD., Seoul (KR)

(72) Inventors: Sang A Ju, Seoul (KR); Hyun Gu Im, Seoul (KR); Jae Man Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/638,474

(22) Filed: Mar. 4, 2015

(65) Prior Publication Data

US 2016/0222195 A1 Aug. 4, 2016

(30) Foreign Application Priority Data

Jan. 29, 2015 (KR) ........................ 10-2015-0014570

(51) Int. Cl.
*C08K 9/06* (2006.01)
*C08K 9/02* (2006.01)
*C08K 3/22* (2006.01)

(52) U.S. Cl.
CPC . *C08K 9/06* (2013.01); *C08K 3/22* (2013.01); *C08K 9/02* (2013.01); *C08K 2003/2227* (2013.01)

(58) Field of Classification Search
None
See application file for complete search history.

(56) References Cited

U.S. PATENT DOCUMENTS

| | | | | |
|---|---|---|---|---|
| 3,576,610 A * | 4/1971 | Matthewson, Jr. | .. | C09K 3/1436 427/215 |
| 4,935,199 A * | 6/1990 | Nishio | ................... | B22F 3/1266 264/624 |
| 5,254,411 A * | 10/1993 | Takeda | ..................... | B05D 3/04 427/377 |
| 5,665,511 A * | 9/1997 | Imai | ................... | G03G 9/09716 430/108.21 |
| 5,681,883 A * | 10/1997 | Hill | .......................... | C08K 3/38 523/445 |
| 6,162,849 A * | 12/2000 | Zhuo | ........................ | C08K 3/38 524/404 |
| 6,350,713 B1 * | 2/2002 | Petrak | ................... | C04B 35/581 428/366 |
| 6,759,118 B2 * | 7/2004 | Finn | .................. | G03G 15/2057 399/333 |

(Continued)

FOREIGN PATENT DOCUMENTS

CN 101654778 A 2/2010
EP 1 908 802 A1 4/2008

(Continued)

OTHER PUBLICATIONS

Wang et al. "Study on High Thermal Conductive BN/Epoxy Resin Composites" Applied Mechanics and Materials, vols. 105-107, pp. 1751-1754, 2012.*

(Continued)

*Primary Examiner* — Robert S Loewe
(74) *Attorney, Agent, or Firm* — Birch, Stewart, Kolasch & Birch, LLP

(57) ABSTRACT

An inorganic filler according to an embodiment of the present invention includes a boron nitride agglomerate and a coating layer formed on the boron nitride agglomerate and including a —Si—R—$NH_2$ group, and R is selected from the group consisting of an alkyl group having 1 to 3 carbon atoms, an alkene group having 2 to 3 carbon atoms, and an alkyne group having 2 to 3 carbon atoms.

17 Claims, 4 Drawing Sheets

(56) References Cited

U.S. PATENT DOCUMENTS

| | | | |
|---|---|---|---|
| 7,524,560 B2 | 4/2009 | Paisner et al. | |
| 7,527,859 B2 | 5/2009 | Zhong et al. | |
| 7,854,795 B2 * | 12/2010 | Kim | C09D 5/084 |
| | | | 106/14.14 |
| 8,440,292 B2 * | 5/2013 | Kanakarajan | C08L 63/00 |
| | | | 174/258 |
| 8,592,844 B2 * | 11/2013 | Izutani | H01L 33/642 |
| | | | 257/717 |
| 8,784,980 B2 * | 7/2014 | Lin | C08K 9/04 |
| | | | 428/220 |
| 8,834,739 B1 * | 9/2014 | Cumberland | C09K 5/10 |
| | | | 252/73 |
| 2002/0006373 A1 * | 1/2002 | Clere | C01B 21/0648 |
| | | | 423/290 |
| 2003/0026989 A1 * | 2/2003 | George | B01J 2/006 |
| | | | 428/402 |
| 2005/0041373 A1 * | 2/2005 | Pruss | C01B 21/064 |
| | | | 361/508 |
| 2010/0226095 A1 * | 9/2010 | Mimura | H01L 23/3737 |
| | | | 361/707 |
| 2011/0071014 A1 * | 3/2011 | Kmetz | C04B 35/565 |
| | | | 501/95.2 |
| 2014/0045972 A1 | 2/2014 | Du et al. | |
| 2014/0080952 A1 | 3/2014 | Raman et al. | |
| 2014/0240989 A1 * | 8/2014 | Hardikar | B29C 45/14 |
| | | | 362/294 |
| 2014/0349105 A1 * | 11/2014 | Yamazaki | C08G 59/4042 |
| | | | 428/323 |
| 2015/0099078 A1 * | 4/2015 | Fish | B05D 3/0254 |
| | | | 428/36.4 |

FOREIGN PATENT DOCUMENTS

| | | | | |
|---|---|---|---|---|
| JP | 05247182 A | * | 9/1993 | C08G 59/62 |
| JP | 2003-113313 A | | 4/2003 | |
| JP | 2003-128467 | * | 8/2003 | C04B 35/583 |
| JP | WO 2013081061 A1 | * | 6/2013 | C08G 59/4042 |

OTHER PUBLICATIONS

Machine translation of JP-05247182, translation generated on Feb. 2016, 3 pages.*

Machine translation of JP-2003-128467, translation generated on Feb. 2016, 4 pages.*

* cited by examiner

INORGANIC FILLER, RESIN COMPOSITION COMPRISING THE SAME AND HEAT RADIATION SUBSTRATE USING THE SAME

CROSS-REFERENCE TO RELATED APPLICATION

This application claims priority to and the benefit of Korean Patent Application No. 2015-0014570, filed on Jan. 29, 2015, the disclosure of which is incorporated herein by reference in its entirety.

BACKGROUND

1. Field of the Invention

The present invention relates to an inorganic filler, and more specifically, to the inorganic filler included in a resin composition.

2. Discussion of Related Art

Light emitting devices including a light emitting element such as a light emitting diode (LED) or the like are used as various types of light sources. As semiconductor techniques develop, high outputs of light emitting elements are accelerating. In order to stably cope with large amounts of light and heat emitted from light emitting elements, heat radiation performance in light emitting elements is being demanded.

Further, as electronic components become highly integrated and have high performance, heat radiation problems of printed circuit boards mounted on electronic components are of increasing concern.

In general, a resin composition including a resin and an inorganic filler may be used for heat radiation of a light emitting element or a printed circuit board.

Here, the inorganic filler may include boron nitride. Boron nitride has excellent heat conductivity and heat radiation performance, and excellent electrical insulation performance due to its high electrical resistance. However, boron nitride has the problem of anisotropic heat conductivity. In order to resolve this problem, a boron nitride agglomerate in which plate-shaped boron nitride agglomerates together may be used, but thermal conductivity may be decreased due to pores in the boron nitride agglomerate, and the boron nitride agglomerate is easily broken due to low bonding strength within the plate-shaped boron nitride.

Further, since boron nitride has a low coefficient of friction and high lubricity, there is a problem in that chemical affinity between boron nitride and other materials is low.

SUMMARY OF THE INVENTION

A technical subject to be addressed in the present invention is to provide an inorganic filler included in a resin composition.

According to an aspect of the present invention, there is provided an inorganic filler which includes a boron nitride agglomerate; and a coating layer formed on the boron nitride agglomerate and including a —Si—R—$NH_2$ group, where R is selected from the group consisting of an alkyl group having 1 to 3 carbon atoms, an alkene group having 2 to 3 carbon atoms, and an alkyne group having 2 to 3 carbon atoms.

The coating layer may include an —O—Si—R—$NH_2$ group.

The coating layer may include the following functional group.

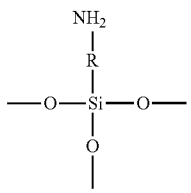

The coating layer may include a polymer having the following unit.

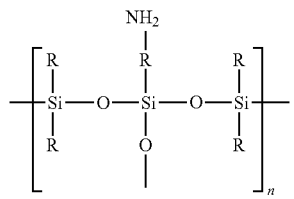

The coating layer may have a thickness in the range of 1 to 2 μm.

According to another aspect of the present invention, there is provided an inorganic filler which includes a boron nitride agglomerate; and pores formed in the boron nitride agglomerate, wherein at least some of the pores are filled with an inorganic substance containing silicon (Si).

The inorganic filler may further include a coating layer formed on a surface of the boron nitride agglomerate and formed of the inorganic substance containing Si, and a functional group may be the formed on the coating layer.

The functional group may include an amino group.

The inorganic substance containing Si may include silicon oxycarbonitride, (SiCNO) or silicon carbonitride (SiCN).

According to still another aspect of the present invention, there is provided a resin composition which includes a resin; and an inorganic filler including a boron nitride agglomerate, wherein a coating layer including a —Si—R—$NH_2$ group is formed on the boron nitride agglomerate, and R is selected from the group consisting of an alkyl group having 1 to 3 carbon atoms, an alkene group having 2 to 3 carbon atoms, and an alkyne group having 2 to 3 carbon atoms.

The resin may be an epoxy-based resin, the inorganic filler may further include aluminum oxide, and the epoxy-based resin at 15 to 35 vol %; and the inorganic filler at 65 to 85 vol % may be included in the resin composition.

The boron nitride agglomerate on which the coating layer is formed may be included at 55 to 85 vol %; and the aluminum oxide may be included at 15 to 45 vol % with respect to 100 vol % of the inorganic filler.

According to still another aspect of the present invention, there is provided a heat radiation substrate including a resin composition which includes a resin; and an inorganic filler including a boron nitride agglomerate, wherein a coating layer including a —Si—R—$NH_2$ group is formed on the boron nitride agglomerate, and R is selected from the group consisting of an alkyl group having 1 to 3 carbon atoms, an alkene group having 2 to 3 carbon atoms, and an alkyne group having 2 to 3 carbon atoms.

The heat radiation substrate may have thermal conductivity of 18 W/mK or more.

The heat radiation substrate may have peel strength of 0.8 kgf/cm or more.

According to still another aspect of the present invention, there is provided a heat radiation substrate formed of a resin composition including a resin and a surface-coated boron nitride agglomerate, and when a predetermined pressure is applied to a square-column-shaped specimen prepared from the heat radiation substrate and having a height of 127 mm, a width of 3.2 mm, and a length of 12.7 mm or a square-column-shaped specimen prepared from the heat radiation substrate and having a height of 80±2 mm, a width of 4±0.2 mm, and a length of 10±0.2 mm at a rate of 10 mm/min to break the specimen into a first portion and a second portion, all fracture surfaces of the first portion and the second portion include a piece of the surface-coated boron nitride agglomerate.

A diameter of the piece of the boron nitride agglomerate may be 30% or more of an average diameter of the boron nitride agglomerate.

A coating layer of the boron nitride agglomerate may include a —Si—R—NH$_2$ group.

The piece of the boron nitride agglomerate may be formed on corresponding positions of the fracture surfaces of the first portion and the second portion.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
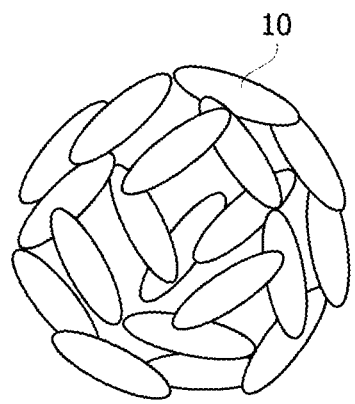
FIG. 1 shows a boron nitride agglomerate.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

The present invention may be variously modified and may be implemented in various forms, and specific embodiments will be exemplified in the drawings and described. However, the present invention is not intended to be limited to the specific embodiments, and it should be understood that the present invention covers all such modifications, equivalents, and substitutes within the spirit and the technical scope of the present invention.

It will be understood that, although the terms first, second or the like may be used herein to describe various elements, these elements should not be limited by these terms. These terms are only used to distinguish one element from another. For example, a first element could be termed a second element, and similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

In the drawings, the thicknesses of layers, regions or the like are exaggerated for clarity. Like reference numerals designate like elements throughout the specification. It will be understood that when a part such as a layer, a film, a region, a plate or the like is referred to as being "in front of" another part, it can be directly in front of the other part or intervening parts may also be present. In contrast, when a part is referred to as being "directly in front of" another part, there are no intervening parts present.

Hereinafter, exemplary embodiments of the present invention will be described in detail in conjunction with the appended drawings. Like reference numerals designate like elements throughout the specification, and the repeated description thereof will be omitted.

A resin composition according to an embodiment of the present invention includes a resin and an inorganic filler. Here, the resin may include an epoxy compound and a curing agent. Here, a volume ratio of the epoxy compound to the curing agent may be in the range of 10:1 to 10:10. In the present specification, the epoxy compound may be used interchangeably with an epoxy-based resin.

Here, the epoxy compound may include at least one of a crystalline epoxy compound, a non-crystalline epoxy compound, and a silicone epoxy compound.

The crystalline epoxy compound may include a mesogen structure. The mesogen is a basic unit of a liquid crystal, and includes a rigid structure.

Further, the non-crystalline epoxy compound may be a common non-crystalline epoxy compound having two or more epoxy groups in its molecules, and for example, may be a glycidyl ether compound derived from bisphenol A or bisphenol F.

Here, as the curing agent, at least one or a mixture of two or more types of an amine-based curing agent, a phenol-based curing agent, an acid anhydride-based curing agent, a polymercaptan-based curing agent, a polyaminoamidebased curing agent, an isocyanate-based curing agent, and a block isocyanate-based curing agent may be used.

Further, the inorganic filler includes a boron nitride agglomerate in which plate-shaped boron nitride agglomerates together, and aluminum oxide.

Here, a coating layer formed of an inorganic substance containing silicon (Si) is formed on the boron nitride agglomerate according to the embodiment of the present invention, and an amino group is formed on the coating layer. Further, the inorganic substance containing Si may fill at least some pores in the boron nitride agglomerate.

Here, the inorganic substance containing Si may further include nitrogen (N). Further, the inorganic substance containing Si may further include at least one of carbon (C) and oxygen (O). For example, the inorganic substance containing Si may include silicon oxycarbonitride (SiCNO) or silicon carbonitride (SiCN).

That is, the coating layer formed on the boron nitride agglomerate according to the embodiment of the present invention includes the following Functional group 1.

[Functional group 1]

Here, R may be selected from the group consisting of an alkyl group having 1 to 3 carbon atoms, an alkene group having 2 to 3 carbon atoms, and an alkyne group having 2 to 3 carbon atoms.

Functional group 1 may include the following Functional group 2.

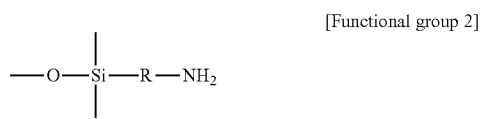

[Functional group 2]

Here, R may be selected from the group consisting of an alkyl group having 1 to 3 carbon atoms, an alkene group having 2 to 3 carbon atoms, and an alkyne group having 2 to 3 carbon atoms.

Further, Functional group 2 may include the following Functional group 3.

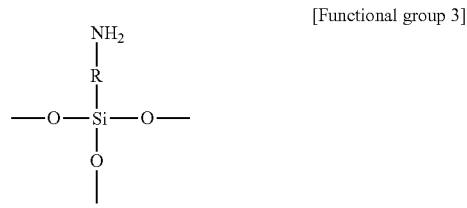

[Functional group 3]

Here, R may be selected from the group consisting of an alkyl group having 1 to 3 carbon atoms, an alkene group having 2 to 3 carbon atoms, and an alkyne group having 2 to 3 carbon atoms.

Further, Functional group 3 may include the following Functional group 4.

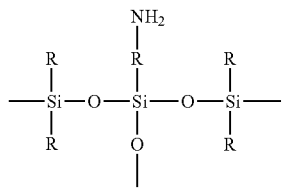

[Functional group 4]

Here, R may be selected from the group consisting of an alkyl group having 1 to 3 carbon atoms, an alkene group having 2 to 3 carbon atoms, and an alkyne group having 2 to 3 carbon atoms.

That is, the coating layer formed on the boron nitride agglomerate according to the embodiment of the present invention includes a polymer having the following unit.

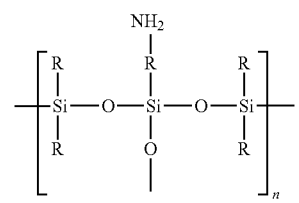

As described above, when the boron nitride agglomerate is coated with the inorganic substance containing Si, and at least some pores in the boron nitride agglomerate are filled with the inorganic substance containing Si, an air layer in the boron nitride agglomerate may be minimized, and thus thermal conductivity of the boron nitride agglomerate may be increased, and bonding strength within the plate-shaped boron nitride may be increased, and thereby the boron nitride agglomerate may be prevented from breaking. Further, when the coating layer is formed on the boron nitride agglomerate, the functional group may be easily formed, and when the functional group is formed on the coating layer of the boron nitride agglomerate, chemical affinity between the boron nitride agglomerate and the resin may be increased.

Figure 2:
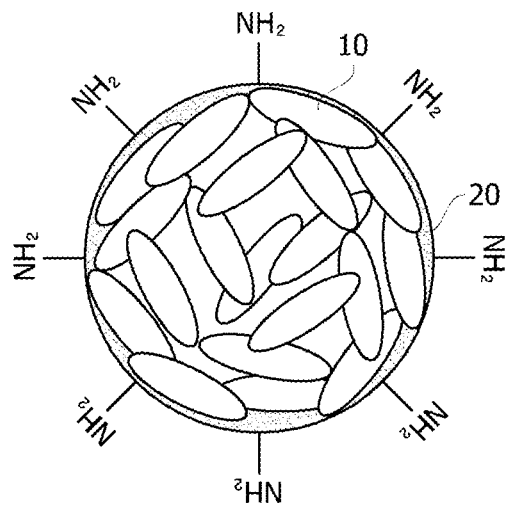
FIG. 2 shows the boron nitride agglomerate treated with a polysilazane and an amino silane according to an embodiment of the present invention.

FIG. 1 shows the boron nitride agglomerate, and FIG. 2 shows the boron nitride agglomerate treated with a polysilazane and an amino silane according to the embodiment of the present invention. Referring to FIG. 1, the boron nitride agglomerate 10 is formed by agglomerating the plate-shaped boron nitride together. Referring to FIG. 2, the coating layer 20 may be formed on a surface of the boron nitride agglomerate 10. The coating layer 20 may include an inorganic substance, and the inorganic substance may include Si, etc. Further, a functional group such as an amino group may be formed on the coating layer 20.

Here, the inorganic substance containing Si may be formed from a polysilazane (PSZ) of Formula 1.

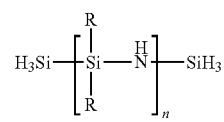

[Formula 1]

Here, R may be selected from the group consisting of an alkyl group having 1 to 3 carbon atoms, an alkene group having 2 to 3 carbon atoms, and an alkyne group having 2 to 3 carbon atoms, and n is a positive integer.

A mechanism forming the inorganic substance containing Si from the polysilazane is shown in the following Reaction formula 1.

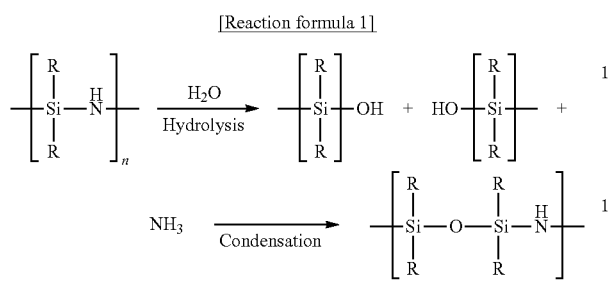

[Reaction formula 1]

Here, R may be selected from the group consisting of an alkyl group having 1 to 3 carbon atoms, an alkene group having 2 to 3 carbon atoms, and an alkyne group having 2 to 3 carbon atoms, and n is a positive integer.

That is, the polysilazane may be formed to the inorganic substance containing Si through a process of a hydrolysis reaction to break the bond between Si and N and a following process of a condensation reaction. The polysilazane has a higher molecular weight than a silazane having a single molecule. Accordingly, the boron nitride agglomerate may be evenly coated with the inorganic substance containing Si and formed from the polysilazane, and the inorganic substance may easily permeate the pores in the boron nitride agglomerate. Further, when the boron nitride agglomerate is coated with the silazane having a single molecule, a —NH group or a —NH$_2$ group is directly bound to a Si molecule, and bound to a terminal of the molecule, and thus a —NH group or a —NH$_2$ group may not be formed. On the other hand, when the boron nitride agglomerate is coated with the polysilazane according to the embodiment of the present invention, the —NH$_2$ group is not directly bound to a Si molecule, but bound to R which is bound to Si, and thus the —NH$_2$ group may be formed on the surface of the coating layer, increasing bonding strength between the resin and the boron nitride agglomerate.

According to the embodiment of the present invention, an additive such as an amino silane may be added to form the amino group on the coating layer. A reaction mechanism between the polysilazane and the amino silane is shown in Reaction formula 2.

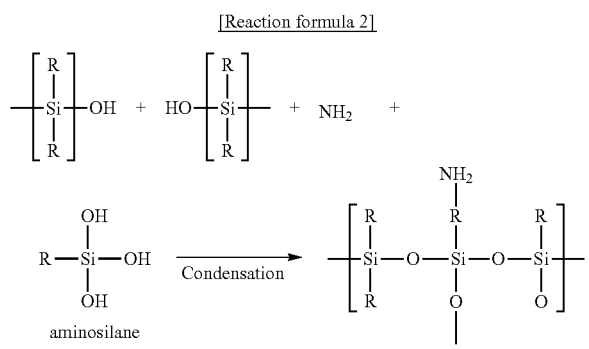

[Reaction formula 2]

Here, R may be selected from the group consisting of an alkyl group having 1 to 3 carbon atoms, an alkene group having 2 to 3 carbon atoms, and an alkyne group having 2 to 3 carbon atoms.

That is, an inorganic substance including the amino group may be formed by a condensation reaction between the amino silane and the hydrolyzed polysilazane as shown in Reaction formula 2. Here, the amino silane may be derived from Formula 2.

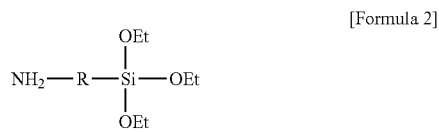

[Formula 2]

Here, R may be selected from the group consisting of an alkyl group having 1 to 3 carbon atoms, an alkene group having 2 to 3 carbon atoms, and an alkyne group having 2 to 3 carbon atoms.

Figure 3:
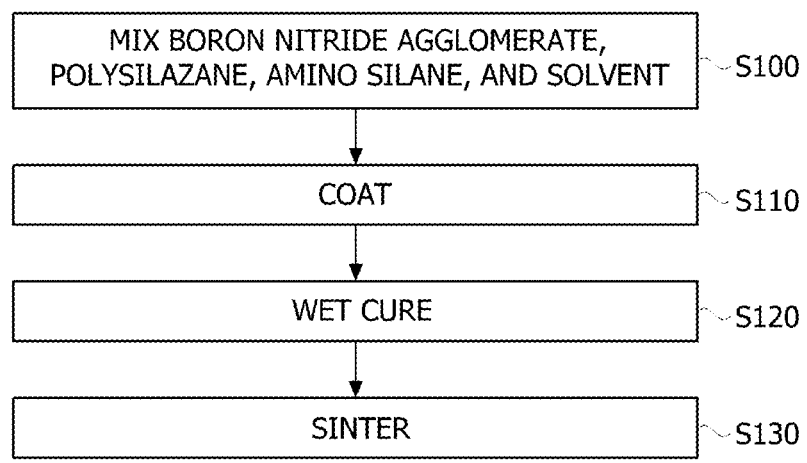
FIG. 3 shows a method of preparing the boron nitride agglomerate according to the embodiment of the present invention.

FIG. 3 shows a method of preparing the boron nitride agglomerate according to the embodiment of the present invention.

Referring to FIG. 3, the boron nitride agglomerate of FIG. 1 is mixed with the polysilazane, the amino silane, and a solvent (S100), and then is coated (S110). Here, the solvent is volatilized in a vacuum state. Here, the boron nitride agglomerate may refer to the agglomerate in which the plate-shaped boron nitride agglomerates together. When the boron nitride agglomerate is analyzed by EDX analysis, boron (B) may be 58.42 wt %, and nitrogen (N) may be 41.58 wt %.

Accordingly, a liquid-phase inorganic substance including Si may be formed in the pores and on the surface of the boron nitride agglomerate. Here, when the boron nitride agglomerate is analyzed by EDX analysis, B may be 50.98 wt %, C may be 6.85 wt %, N may be 32.07 wt %, O may be 3.41 wt %, and Si may be 2.97 wt %.

Next, after wet curing a mixture (S120), the mixture is sintered (S130). For this, the mixture may be treated at a temperature in the range of 160 to 180° C. for 12 to 24 hours, and then may be pyrolysed at 300° C. for 2 to 4 hours. Through a pyrolysis process, $CH_4$, $C_2H_4$, $C_2H_6$, $NH_3$ or the like may be emitted, and thereby the boron nitride agglomerate of which the pores and surface are filled with the inorganic substance including Si of FIG. 2 may be obtained. Here, when the boron nitride agglomerate is analyzed by EDX analysis, B may be 45.95 wt %, C may be 8.79 wt %, N may be 35.06 wt %, O may be 5.35 wt %, and Si may be 4.85 wt %.

When the pyrolysis process in step S130 is performed in a nitrogen atmosphere, the pores may be filled with the inorganic substance including SiCN.

As described above, when the polysilazane is mixed with the boron nitride agglomerate and heated, the mixture is polymerized after the hydrolysis reaction, and thereby the polysilazane permeates into the pores of the boron nitride agglomerate or the surface of the boron nitride agglomerate is coated with the polysilazane. A polymerization reaction of the polysilazane is easily generated as compared to the silazane which is a monomer, and thus the polysilazane may easily permeate into the pores of the boron nitride agglomerate, and the surface of the boron nitride agglomerate may be evenly coated with the polysilazane.

Here, a thickness of the coating layer formed on the boron nitride agglomerate 10 may be 1 to 2 μm. When the thickness of the coating layer is less than 1 μm, the amino group may not be sufficiently formed on the coating layer, and thus peel strength may be decreased. Further, when the thickness of the coating layer is more than 2 μm, the boron nitride agglomerates agglomerate together, and thus thermal conductivity may be decreased.

Here, the resin composition including the boron nitride agglomerate according to the embodiment of the present invention may include the resin at 15 to 35 vol % and the inorganic filler at 65 to 85 vol %. When the resin and the inorganic filler are included in the above-described range, the resin composition having excellent thermal conductivity, stability at room temperature, and dispersibility may be obtained. Particularly, when the inorganic filler including the boron nitride agglomerate according to the embodiment of the present invention is included at an amount of more than 85 vol %, a content of the resin relatively decreases, fine pores are formed between the inorganic filler and the resin, and thus thermal conductivity may be decreased, and peel strength and bend strength may be decreased. Further, when the inorganic filler including the boron nitride agglomerate according to the embodiment of the present invention is included at an amount of less than 65 vol %, thermal conductivity may be decreased.

Here, the boron nitride agglomerate according to the embodiment of the present invention may be included at 55 to 85 vol % and the aluminum oxide may be included at 15 to 45 vol % with respect to 100 vol % of the inorganic filler. When the boron nitride agglomerate according to the embodiment of the present invention is included at an amount of more than 85 vol % with respect to 100 vol % of the inorganic filler, peel strength may be decreased. Further, when the boron nitride agglomerate according to the embodiment of the present invention is included at an amount of less than 55 vol % with respect to 100 vol % of the inorganic filler, thermal conductivity may be decreased.

Figure 4:
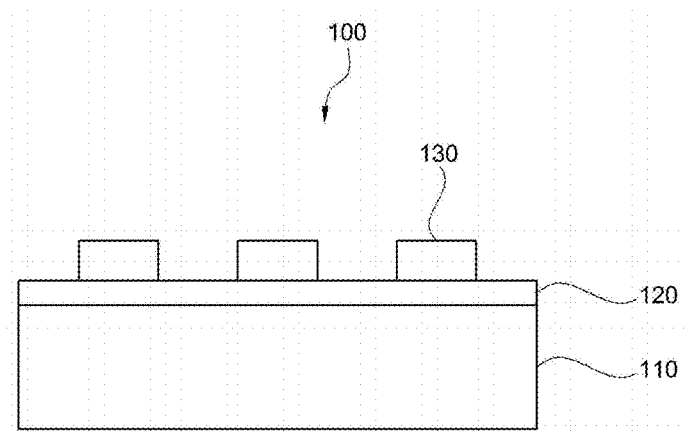
FIG. 4 is a cross-sectional view illustrating a printed circuit board according to the embodiment of the present invention.

The resin composition including the inorganic filler according to the embodiment of the present invention may be applied to a printed circuit board. FIG. 4 is a cross-sectional view illustrating a printed circuit board according to the embodiment of the present invention.

Referring to FIG. 4, the printed circuit board 100 includes a substrate 110, an insulating layer 120, and a circuit pattern 130.

The substrate 110 may be formed of silver, copper, aluminum, nickel, gold, platinum, and an alloy thereof.

The insulating layer 120 formed of the resin composition including the inorganic filler according to the embodiment of the present invention is formed on the substrate 110.

The circuit pattern 130 is formed on the insulating layer 120. The circuit pattern 130 may be formed of a metal such as copper, nickel, etc.

The insulating layer 120 insulates between the metal plate 110 and the circuit pattern 130.

Figure 5:
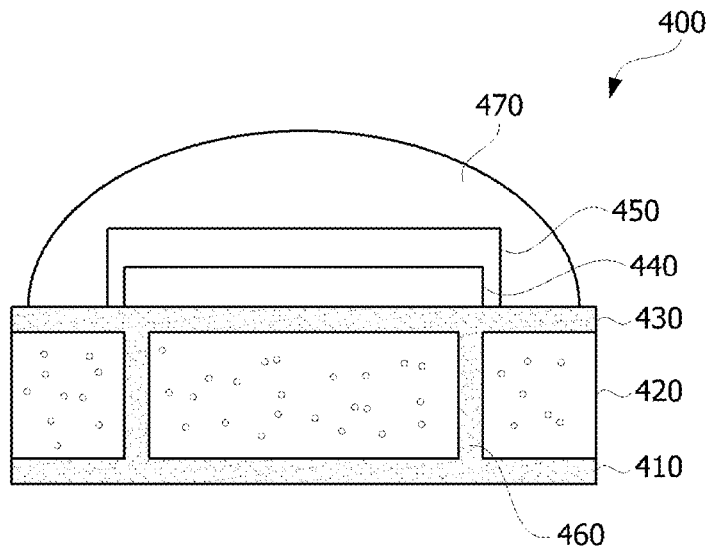
FIG. 5 is a cross-sectional view illustrating a light emitting element module according to the embodiment of the present invention.

The resin composition including the inorganic filler according to the embodiment of the present invention may also be applied to a light emitting element module. FIG. 5 is a cross-sectional view illustrating a light emitting element module according to the embodiment of the present invention, and FIG. 6 is a cross-sectional view illustrating the light emitting element module formed on the printed circuit board according to the embodiment of the present invention.

Referring to FIG. 5, the light emitting element module 400 includes a lower wiring 410, a heat radiation substrate 420 formed on the lower wiring 410, an upper wiring 430 formed on the heat radiation substrate 420, a light emitting element 440 formed on the upper wiring 430, a phosphor layer 450 formed on the light emitting element 440, a via 460 connecting the lower wiring 410 and the upper wiring 430, and a lens 470. The heat radiation substrate 420 may be formed of the resin composition including the inorganic filler according to the embodiment of the present invention.

Figure 6:
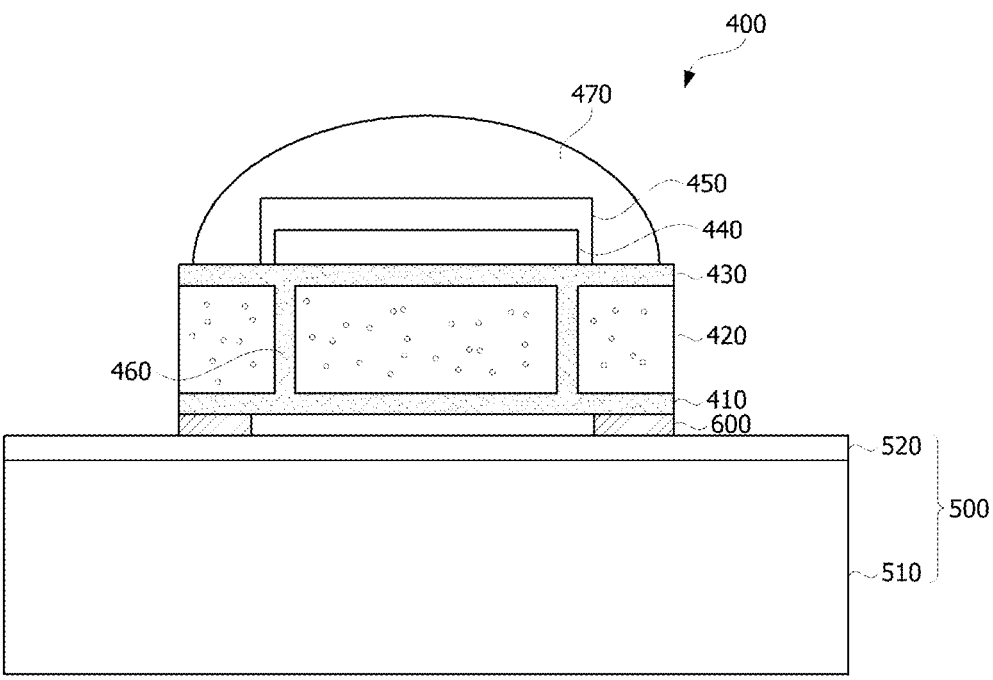
FIG. 6 is a cross-sectional view illustrating the light emitting element module formed on the printed circuit board according to the embodiment of the present invention.

Referring to FIG. 6, a printed circuit board 500 includes a substrate 510 and a wiring 520 formed on the substrate 510, and the printed circuit board 500 and the light emitting element module 400 may be combined by a solder 600.

When the heat radiation substrate formed of the resin composition including the inorganic filler according to the embodiment of the present invention is prepared as a square-column-shaped specimen having a height of 127 mm, a width of 3.2 mm, and a length of 12.7 mm or a square-column-shaped specimen having a height of 80±2 mm, a width of 4±0.2 mm, and a length of 10±0.2 mm, and a predetermined pressure is applied thereto at a rate of 10 mm/min to break the specimen into a first portion and a second portion, all fracture surfaces of the first portion and the second portion include a piece of the surface-coated boron nitride agglomerate.

Here, a diameter of the piece of the boron nitride agglomerate may be 30% or more of an average diameter of the boron nitride agglomerate.

The piece of the boron nitride agglomerate may be formed on corresponding positions of the fracture surfaces of the first portion and the second portion.

Hereinafter, the present invention will be described in conjunction with examples and comparative examples.

EXPERIMENTAL EXAMPLE

After the resin composition obtained in examples and comparative examples was cured, a circular sample having a diameter of 12.7 mm and a thickness of 450 μm was prepared. The circular sample was put into a thermal conductivity meter (product name: LFA447; manufactured by Netzsch Gerätebau GmbH) and then thermal conductivity was measured using a transient hot-wire method.

Further, after a copper substrate having a thickness of 62.5 mm was coated with the resin composition obtained in examples and comparative examples to form a coating layer having a thickness of 450 μm, the coating layer was dried at 150° C. for 15 minutes. Then, after the copper substrate having a thickness of 62.5 mm was stacked on the resin composition, vacuum pressing was performed under conditions of 0.1 torr, 180° C., and 50 Mpa to prepare a sample. Peel strength was measured using a device manufactured by YM-tech under conditions of lifting up the sample at a rate of 50 mm/min in a perpendicular direction (an angle of 90°).

Further, after the sample of an ASTM standard (127 mm*12.7 mm*3.2 mm) was prepared using the resin composition obtained in examples and comparative examples, bend strength of a material was measured using a 3 point bending device. That is, a predetermined pressure was applied to the sample and the sample was pressed in a perpendicular direction to the sample at a rate of 10 mm/min using the 3 point bending device, and thereby stress was measured. Here, the applied stress, for example, may be 10 kgf.

Preparation of Boron Nitride Agglomerate

Example 1-1

The boron nitride agglomerate in which the plate-shaped boron nitride was agglomerated together at 46.7 vol %, the polysilazane of Formula 1 at 4.65 vol %, the amino silane of Formula 2 at 4.65 vol %, and an acetone solvent were mixed to form a coating layer on the boron nitride agglomerate at 80° C., the coating layer was wet-cured at 180° C. for 12 hours and sintered at 300° C. for 4 hours, and thereby the boron nitride agglomerate according to the embodiment of the present invention was prepared. Aluminum oxide at 24 vol %, a bisphenol A-type epoxy compound at 16.2 vol %, and diaminodiphenylsulfone at 3.8 vol % were further added thereto and stirred.

Comparative Example 1-1

The boron nitride agglomerate in which the plate-shaped boron nitride was agglomerated together at 46.7 vol %, the polysilazane of Formula 1 at 4.65 vol %, an epoxy silane at 4.65 vol %, and the acetone solvent were mixed, the coating layer was formed on the boron nitride agglomerate at 80° C., the coating layer was wet-cured at 180° C. for 12 hours and sintered at 300° C. for 4 hours, and thereby the boron nitride agglomerate according to the embodiment of the present invention was prepared. Aluminum oxide at 24 vol %, the bisphenol A-type epoxy compound at 16.2 vol %, and diaminodiphenylsulfone at 3.8 vol % were further added thereto and stirred.

Comparative Example 1-2

The boron nitride agglomerate in which the plate-shaped boron nitride was agglomerated together at 46.7 vol %, the polysilazane of Formula 1 at 4.65 vol %, an acryl silane at 4.65 vol %, and the acetone solvent were mixed, the coating layer was formed on the boron nitride agglomerate at 80° C., the coating layer was wet-cured at 180° C. for 12 hours and sintered at 300° C. for 4 hours, and thereby the boron nitride agglomerate according to the embodiment of the present invention was prepared. Aluminum oxide at 24 vol %, the bisphenol A-type epoxy compound at 16.2 vol %, and diaminodiphenylsulfone at 3.8 vol % were further added thereto and stirred.

Table 1 shows the results of the measurements of thermal conductivity, peel strength and bend strength of the resin compositions prepared according to Example 1-1, Comparative Example 1-1 and Comparative Example 1-2.

TABLE 1

| Experiment number | Thermal conductivity (W/mK) | Peel strength (kgf/cm²) | Bend strength (Mpa) |
|---|---|---|---|
| Example 1-1 | 22.2 | 1.11 | 36.7 |
| Comparative Example 1-1 | 17.8 | 0.82 | 33.1 |
| Comparative Example 1-2 | 15.4 | 0.91 | 39.4 |

As shown in Table 1, in Example 1-1 in which the amino group was formed on the coating layer of the boron nitride agglomerate using the amino silane, it may be determined that thermal conductivity was 18 W/mK or more, peel strength was 0.8 kgf/cm or more, and bend strength was 30 MPa or more. On the other hand, in Comparative Examples 1-1 and 1-2 in which the epoxy group or acryl group was formed on the coating layer of the boron nitride agglomerate using the epoxy silane or acryl silane, it may be determined that thermal conductivity, peel strength and bend strength were relatively lower than those in Example 1-1.

Thickness of Coating Layer

The boron nitride agglomerate, the polysilazane of Formula 1, the amino silane of Formula 2, and the acetone solvent were mixed, the coating layer was formed on the boron nitride agglomerate at 80° C., the coating layer was wet-cured at 180° C. for 12 hours and sintered at 300° C. for 4 hours, and thereby the boron nitride agglomerate according to the embodiment of the present invention was prepared. The prepared boron nitride agglomerate at 56 vol %, aluminum oxide at 24 vol %, the bisphenol A-type epoxy compound at 16.2 vol %, and diaminodiphenylsulfone at 3.8 vol % were mixed and stirred. A thickness of the coating layer was adjusted by changing a relative content ratio or the stirring time of the boron nitride agglomerate, the polysilazane of Formula 1, and the amino silane of Formula 2.

The thickness of the coating layer was measured using a SEM picture of a fracture surface of the boron nitride agglomerate. That is, the thickness of the coating layer was measured at 5 positions based on one boron nitride agglomerate in a SEM picture, and an average thickness of each thicknesses measured at the 5 positions was calculated. The thickness measured at each position was measured by the distance from a boundary surface between the boron nitride agglomerate and the coating layer to an outermost line of the coating layer.

Table 2 shows the results of the measurements of thermal conductivity, peel strength and bend strength according to the thickness of the coating layer formed on the surface of the boron nitride agglomerate.

TABLE 2

| Experiment number | Thickness of coating layer (μm) | Thermal conductivity (W/mK) | Peel strength (kgf/cm²) | Bend strength (Mpa) |
|---|---|---|---|---|
| Example 2-1 | 1 | 23.3 | 0.82 | 34.1 |
| Example 2-2 | 1.5 | 22.8 | 0.97 | 35.3 |
| Example 2-3 | 2 | 22.2 | 1.11 | 36.7 |
| Comparative Example 2-1 | 0 | 25.4 | 0.34 | 30.2 |
| Comparative Example 2-2 | 0.5 | 23.9 | 0.67 | 32.9 |
| Comparative Example 2-3 | 2.3 | 17.3 | 1.15 | 36.9 |
| Comparative Example 2-4 | 2.5 | 16.2 | 1.18 | 37.2 |
| Comparative Example 2-5 | 5 | 8.4 | 0.43 | 17.5 |
| Comparative Example 2-6 | 10 | 6.5 | 0.26 | 12.3 |

As shown in Table 2, in Examples 2-1 to 2-3 in which the thickness of the coating layer was in the range of 1 to 2 μm, it may be determined that thermal conductivity was 18 W/mK or more, peel strength was 0.8 kgf/cm or more, and bend strength was 30 MPa or more. On the other hand, in Comparative Examples 2-1 to 2-6 in which the thickness of the coating layer was less than 1 μm or more than 2 μm, it may be determined that thermal conductivity, peel strength and bend strength were relatively lower than those in Examples 2-1 to 2-3.

Formation of Fracture Surface

Example 3-1

After the sample of an ASTM standard (127 mm*12.7 mm*3.2 mm) was prepared using the resin composition prepared by Example 1-1, a pressure was applied to the sample, and the sample was pressed in a perpendicular direction to the sample at a rate of 10 mm/min using the 3 point bending device until the sample was split.

Comparative Example 3-1

Aluminum oxide at 24 vol %, a bisphenol A-type epoxy compound at 16.2 vol %, and diaminodiphenylsulfone at 3.8 vol % were further added to the boron nitride agglomerate which had not been treated with the polysilazane and the amino silane at 56 vol %, and were stirred to obtain the resin composition. After the sample of an ASTM standard (127 mm*12.7 mm*3.2 mm) was prepared using the resin composition, a pressure was applied to the sample and the sample was pressed in a perpendicular direction to the sample at a rate of 10 mm/min using the 3 point bending device until the sample was split.

Figure 7:
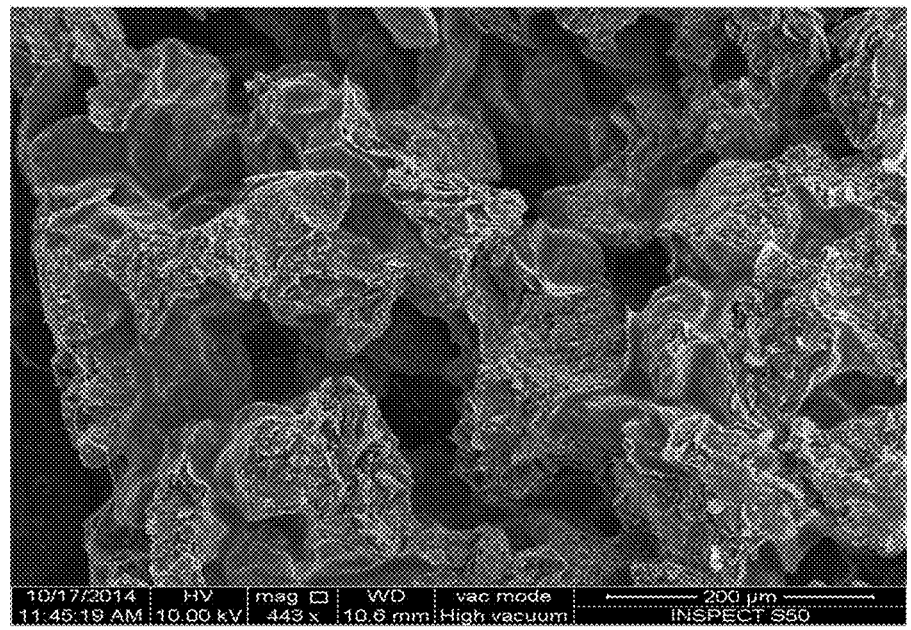
FIG. 7 is a SEM picture of a fracture surface according to Example 3-1.
Figure 8:
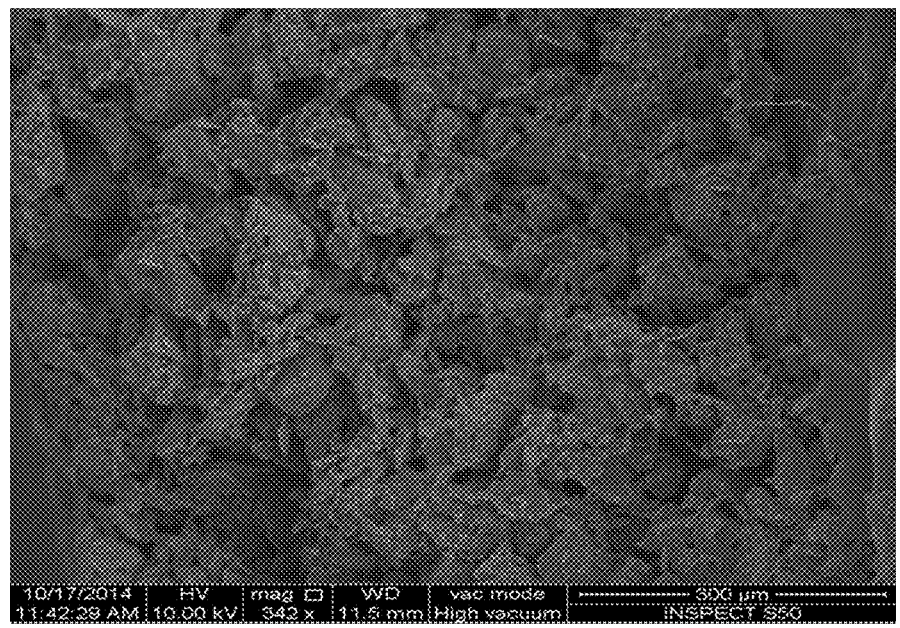
FIG. 8 is a SEM picture of the fracture surface according to Comparative Example 3-1.

FIG. 7 is a SEM picture of a fracture surface according to Example 3-1, and FIG. 8 is a SEM picture of the fracture surface according to Comparative Example 3-1.

Referring to FIGS. 7 to 8, when a predetermined pressure was applied to the heat radiation substrates prepared according to Example 3-1 and Comparative Example 3-1, the heat radiation substrates were split. Here, the boron nitride agglomerate included in the heat radiation substrate prepared according to Example 3-1 was split together with the heat radiation substrate. That is, fracture surfaces of the boron nitride agglomerate were formed on both split surfaces of the heat radiation substrate, and the fracture surfaces of the boron nitride agglomerate may be formed on the corresponding positions of the both split surfaces. This is because chemical affinity between the boron nitride agglomerate according to the embodiment of the present invention and the resin is high. On the other hand, since chemical affinity between the boron nitride agglomerate included in the heat radiation substrate prepared according to Comparative Example 3-1 and the resin is low, the boron nitride agglomerate was separated from the resin. Accordingly, as shown in FIG. 8, even when the predetermined pressure was applied to the heat radiation substrate prepared according to Comparative Example 3-1, the fracture surfaces of the boron nitride agglomerate were not formed.

Content Range of Resin Composition

The boron nitride agglomerate, the polysilazane of Formula 1, the amino silane of Formula 2, and the acetone solvent were mixed, the coating layer was formed on the boron nitride agglomerate at 80° C., the coating layer was wet-cured at 180° C. for 12 hours and sintered at 300° C. for 4 hours, and thereby the boron nitride agglomerate according to the embodiment of the present invention was prepared. Here, a volume ratio of the mixed boron nitride agglomerate, polysilazane and amino silane was 46.7:4.65:4.65. The boron nitride agglomerate according to the embodiment of the present invention, aluminum oxide, a bisphenol A-type epoxy compound, and diaminodiphenylsulfone were mixed and stirred to form the resin composition. In all examples and comparative examples, the bisphenol A type epoxy compound at 81 vol % and diaminodiphenylsulfone at 19 vol % were added with respect to 100 vol % of the resin. Table 3 shows contents of the resin composition according to examples, Table 4 shows contents of the resin composition according to comparative examples, Table 5 shows the result of the measurements of thermal conductivity, peel strength and bend strength according to examples, and Table 6 shows the result of the measurements of thermal conductivity, peel strength and bend strength according to comparative examples.

TABLE 3

| Comparative Example Experiment number | Resin (vol %) | Inorganic filler (vol %) | Epoxy compound vol % (Content in 100 vol % of resin) | Curing agent vol % (Content in 100 vol % of resin) | Boron nitride agglomerate vol % (Content in 100 vol % of inorganic filler) | Aluminum oxide vol % (Content in 100 vol % of inorganic filler) |
|---|---|---|---|---|---|---|
| Example 4-1 | 35 | 65 | 28.35 (81 vol %) | 6.65 (19 vol %) | 55.25 (85 vol %) | 9.75 (15 vol %) |
| Example 4-2 | 35 | 65 | 28.35 (81 vol %) | 6.65 (19 vol %) | 52 (80 vol %) | 13 (20 vol %) |
| Example 4-3 | 35 | 65 | 28.35 (81 vol %) | 6.65 (19 vol %) | 48.75 (75 vol %) | 16.25 (25 vol %) |
| Example 4-4 | 30 | 70 | 24.3 (81 vol %) | 5.7 (19 vol %) | 59.5 (85 vol %) | 10.5 (15 vol %) |
| Example 4-5 | 30 | 70 | 24.3 (81 vol %) | 5.7 (19 vol %) | 56 (80 vol %) | 14 (20 vol %) |
| Example 4-6 | 30 | 70 | 24.3 (81 vol %) | 5.7 (19 vol %) | 52.5 (75 vol %) | 17.5 (25 vol %) |
| Example 4-7 | 30 | 70 | 24.3 (81 vol %) | 5.7 (19 vol %) | 49 (70 vol %) | 21 (30 vol %) |
| Example 4-8 | 20 | 80 | 16.2 (81 vol %) | 3.8 (19 vol %) | 64 (80 vol %) | 16 (20 vol %) |
| Example 4-9 | 20 | 80 | 16.2 (81 vol %) | 3.8 (19 vol %) | 60 (75 vol %) | 20 (25 vol %) |
| Example 4-10 | 20 | 80 | 16.2 (81 vol %) | 3.8 (19 vol %) | 56 (70 vol %) | 24 (30 vol %) |
| Example 4-12 | 20 | 80 | 16.2 (81 vol %) | 3.8 (19 vol %) | 52 (65 vol %) | 28 (35 vol %) |
| Example 4-13 | 20 | 80 | 16.2 (81 vol %) | 3.8 (19 vol %) | 48 (60 vol %) | 32 (40 vol %) |
| Example 4-14 | 15 | 85 | 12.15 (81 vol %) | 2.85 (19 vol %) | 55.25 (65 vol %) | 29.75 (35 vol %) |
| Example 4-15 | 15 | 85 | 12.15 (81 vol %) | 2.85 (19 vol %) | 51 (60 vol %) | 34 (40 vol %) |
| Example 4-16 | 15 | 85 | 12.15 (81 vol %) | 2.85 (19 vol %) | 46.75 (55 vol %) | 38.25 (45 vol %) |

TABLE 4

| Comparative Example Experiment number | Resin (vol %) | Inorganic filler (vol %) | Epoxy compound vol % (Content in 100 vol % of resin) | Curing agent vol % (Content in 100 vol % of resin) | Boron nitride agglomerate vol % (Content in 100 vol % of inorganic filler) | Aluminum oxide vol % (Content in 100 vol % of inorganic filler) |
|---|---|---|---|---|---|---|
| Comparative Example 4-1 | 40 | 60 | 32.4 (81 vol %) | 7.6 (19 vol %) | 51 (85 vol %) | 9 (15 vol %) |

TABLE 4-continued

| Comparative Example Experiment number | Resin (vol %) | Inorganic filler (vol %) | Epoxy compound vol % (Content in 100 vol % of resin) | Curing agent vol % (Content in 100 vol % of resin) | Boron nitride agglomerate vol % (Content in 100 vol % of inorganic filler) | Aluminum oxide vol % (Content in 100 vol % of inorganic filler) |
|---|---|---|---|---|---|---|
| Comparative Example 4-2 | 36 | 64 | 29.16 (81 vol %) | 6.84 (19 vol %) | 54.4 (85 vol %) | 9.6 (15 vol %) |
| Comparative Example 4-3 | 35 | 65 | 28.35 (81 vol %) | 6.65 (19 vol %) | 58.5 (90 vol %) | 6.5 (10 vol %) |
| Comparative Example 4-4 | 35 | 65 | 28.35 (81 vol %) | 6.65 (19 vol %) | 55.9 (86 vol %) | 9.1 (14 vol %) |
| Comparative Example 4-5 | 35 | 65 | 28.35 (81 vol %) | 6.65 (19 vol %) | 47.36 (74 vol %) | 17.64 (26 vol %) |
| Comparative Example 4-6 | 35 | 65 | 28.35 (81 vol %) | 6.65 (19 vol %) | 45.5 (70 vol %) | 19.5 (30 vol %) |
| Comparative Example 4-7 | 30 | 70 | 24.3 (81 vol %) | 5.7 (19 vol %) | 63 (90 vol %) | 7 (10 vol %) |
| Comparative Example 4-8 | 30 | 70 | 24.3 (81 vol %) | 5.7 (19 vol %) | 60.2 (86 vol %) | 9.8 (14 vol %) |
| Comparative Example 4-9 | 30 | 70 | 24.3 (81 vol %) | 5.7 (19 vol %) | 48.3 (69 vol %) | 21.7 (31 vol %) |
| Comparative Example 4-10 | 30 | 70 | 24.3 (81 vol %) | 5.7 (19 vol %) | 45.5 (65 vol %) | 24.5 (35 vol %) |
| Comparative Example 4-11 | 20 | 80 | 16.2 (81 vol %) | 3.8 (19 vol %) | 68 (85 vol %) | 12 (15 vol %) |
| Comparative Example 4-12 | 20 | 80 | 16.2 (81 vol %) | 3.8 (19 vol %) | 64.8 (81 vol %) | 15.2 (19 vol %) |
| Comparative Example 4-13 | 20 | 80 | 16.2 (81 vol %) | 3.8 (19 vol %) | 47.2 (59 vol %) | 32.8 (41 vol %) |
| Comparative Example 4-14 | 20 | 80 | 16.2 (81 vol %) | 3.8 (19 vol %) | 44 (55 vol %) | 36 (45 vol %) |
| Comparative Example 4-15 | 15 | 85 | 12.15 (81 vol %) | 2.85 (19 vol %) | 59.5 (70 vol %) | 25.5 (30 vol %) |
| Comparative Example 4-16 | 15 | 85 | 12.15 (81 vol %) | 2.85 (19 vol %) | 56.1 (66 vol %) | 28.9 (34 vol %) |
| Comparative Example 4-17 | 15 | 85 | 12.15 (81 vol %) | 2.85 (19 vol %) | 45.9 (54 vol %) | 39.1 (46 vol %) |
| Comparative Example 4-18 | 15 | 85 | 12.15 (81 vol %) | 2.85 (19 vol %) | 42.5 (50 vol %) | 42.5 (50 vol %) |
| Comparative Example 4-19 | 14 | 86 | 11.34 (81 vol %) | 2.66 (19 vol %) | 47.3 (55 vol %) | 38.7 (45 vol %) |
| Comparative Example 4-20 | 15 | 85 | 8.1 (81 vol %) | 1.9 (19 vol %) | 49.5 (55 vol %) | 40.5 (45 vol %) |

TABLE 5

| Comparative Example Experiment number | Thermal conductivity (W/mK) | Peel strength (kgf/cm) | Bend strength (MPa) |
|---|---|---|---|
| Example 4-1 | 18.5 | 1.02 | 41.4 |
| Example 4-2 | 18.3 | 1.15 | 41.8 |
| Example 4-3 | 18 | 1.26 | 42.5 |
| Example 4-4 | 20.7 | 0.95 | 38.4 |
| Example 4-5 | 20.2 | 1.17 | 39.1 |
| Example 4-6 | 19 | 1.22 | 39.6 |
| Example 4-7 | 18.1 | 1.29 | 40.2 |
| Example 4-8 | 24.1 | 0.88 | 33.3 |
| Example 4-9 | 23.6 | 1.02 | 34.9 |
| Example 4-10 | 22.2 | 1.11 | 36.7 |
| Example 4-12 | 20.7 | 1.18 | 37.5 |
| Example 4-13 | 18.3 | 1.23 | 38.8 |

TABLE 5-continued

| Comparative Example Experiment number | Thermal conductivity (W/mK) | Peel strength (kgf/cm) | Bend strength (MPa) |
|---|---|---|---|
| Example 4-14 | 23.4 | 0.82 | 30.1 |
| Example 4-15 | 22.2 | 0.93 | 30.8 |
| Example 4-16 | 20.8 | 1.01 | 31.5 |

TABLE 6

| Experiment number | Thermal conductivity (W/mK) | Peel strength (kgf/cm) | Bend strength (MPa) |
|---|---|---|---|
| Comparative Example 4-1 | 13.3 | 0.84 | 38.3 |
| Comparative Example 4-2 | 16.9 | 0.99 | 40.2 |
| Comparative Example 4-3 | 19.6 | 0.62 | 37.3 |
| Comparative Example 4-4 | 18.7 | 0.78 | 39.9 |
| Comparative Example 4-5 | 15.9 | 1.28 | 42.7 |
| Comparative Example 4-6 | 11.8 | 1.3 | 43.5 |
| Comparative Example 4-7 | 23.1 | 0.68 | 34.2 |
| Comparative Example 4-8 | 21.4 | 0.79 | 38.1 |
| Comparative Example 4-9 | 16.7 | 1.31 | 40.8 |
| Comparative Example 4-10 | 13.2 | 1.38 | 41.7 |
| Comparative Example 4-11 | 26.8 | 0.56 | 30.9 |
| Comparative Example 4-12 | 25.5 | 0.77 | 33 |
| Comparative Example 4-13 | 16.9 | 1.25 | 39.1 |
| Comparative Example 4-14 | 14.5 | 1.29 | 40.3 |
| Comparative Example 4-15 | 25.9 | 0.54 | 27.8 |
| Comparative Example 4-16 | 25.4 | 0.76 | 29.4 |
| Comparative Example 4-17 | 17.7 | 1.05 | 31.8 |
| Comparative Example 4-18 | 15.3 | 1.18 | 32.3 |
| Comparative Example 4-19 | 21.1 | 0.78 | 28.9 |
| Comparative Example 4-20 | 23.7 | 0.42 | 13.7 |

As shown in Tables 3 to 6, it may be determined that thermal conductivity was 18 W/mK or more, peel strength was 0.8 kgf/cm or more, and bend strength was 30 MPa or more in Examples 4-1 to 4-16 in which the resin was included at the amount of 15 to 35 vol %, the inorganic filler was included at the amount of 65 to 85 vol %, and the boron nitride agglomerate was included at the amount of 55 to 85 vol % and aluminum oxide was included at the amount of 15 to 45 vol % with respect to 100 vol % of the inorganic filler. On the other hand, in Comparative Examples 4-1 to 4-20 in which the content range of the resin compositions was out of the above-described range, it may be determined that thermal conductivity, peel strength and bend strength were relatively lower than those in Examples 4-1 to 4-16.

According to the embodiment of the present invention, the inorganic filler included in the resin composition applied to the printed circuit board or light emitting device package may be obtained. Accordingly, the resin composition having high dispersibility, excellent insulation performance, high thermal conductivity, and superior adhesion and processability may be obtained. Particularly, the inorganic filler having excellent isotropic heat conductivity, improved chemical affinity between the inorganic filler and the resin, and high peel strength and bend strength may be obtained.

In the above-description, although the present invention was described in reference to the exemplary embodiments, it will be apparent to those skilled in the art that various modifications can be made to the above-described exemplary embodiments of the present invention without departing from the spirit or scope of the invention.

What is claimed is:

1. An inorganic filler comprising:

a boron nitride agglomerate; and a coating layer formed on the boron nitride agglomerate, wherein the coating layer comprises a polymer having the following unit:

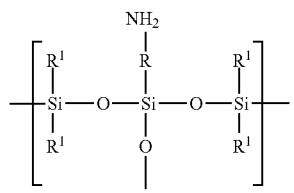

wherein R is selected from the group consisting of an alkylene group having 1 to 3 carbon atoms, an alkenylene group having 2 to 3 carbon atoms, and an alkynylene group having 2 to 3 carbon atoms, and wherein $R^1$ is selected from the group consisting of an alkyl group having 1 to 3 carbon atoms, an alkene group having 2 to 3 carbon atoms, and an alkyne group having 2 to 3 carbon atoms.

2. The inorganic filler of claim 1, wherein a thickness of the coating layer is in a range of 1 to 2 μm.

3. An inorganic filler comprising:

a boron nitride agglomerate; and pores formed on the boron nitride agglomerate, wherein at least some of the pores are filled with an inorganic substance containing silicon (Si), wherein a coating later formed on a surface of the boron nitride agglomerate and formed of the inorganic substance containing Si is further included in the inorganic filler, and a functional group is formed on the coating layer.

4. The inorganic filler of claim 3, wherein the functional group comprises an amino group.

5. The inorganic filler of claim 3, wherein the inorganic substance containing Si comprises silicon oxycarbonitride (SiCNO) or silicon carbonitride (SiCN).

6. A resin composition comprising:

a resin;

an inorganic filler including a boron nitride agglomerate; and a coating layer formed on the boron nitride agglomerate, wherein the coating layer comprises a polymer having the following unit:

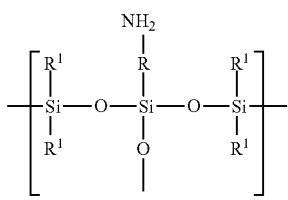

wherein R is selected from the group consisting of an alkylene group having 1 to 3 carbon atoms, an alkenylene group having 2 to 3 carbon atoms, and an alkynylene group having 2 to 3 carbon atoms, and wherein $R^1$ is selected from the group consisting of an alkyl group having 1 to 3 carbon atoms, an alkene group having 2 to 3 carbon atoms, and an alkyne group having 2 to 3 carbon atoms.

7. The resin composition of claim 6, wherein the resin is an epoxy-based resin, the inorganic filler further includes aluminum oxide, and the epoxy-based resin at 15 to 35 vol %; and the inorganic filler at 65 to 85 vol % are included in the resin composition.

8. The resin composition of claim 7, wherein the boron nitride agglomerate on which the coating layer is formed at 55 to 85 vol %; and the aluminum oxide at 15 to 45 vol % are included with respect to 100 vol % of the inorganic filler.

9. A heat radiation substrate comprising:
a resin composition which includes a resin, and an inorganic filler including a boron nitride agglomerate; and
a coating layer is formed on the boron nitride agglomerate,
wherein the coating layer comprises a polymer having the following unit:

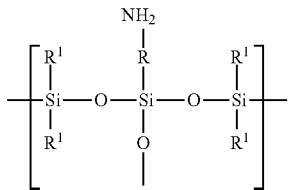

wherein R is selected from the group consisting of an alkylene group having 1 to 3 carbon atoms, an alkenylene group having 2 to 3 carbon atoms, and an alkynylene group having 2 to 3 carbon atoms, and wherein $R^1$ is selected from the group consisting of an alkyl group having 1 to 3 carbon atoms, an alkene group having 2 to 3 carbon atoms, and an alkyne group having 2 to 3 carbon atoms.

10. The heat radiation substrate of claim 9, wherein the resin is an epoxy-based resin, the inorganic filler further includes aluminum oxide, and the epoxy-based resin at 15 to 35 vol %; and the inorganic filler at 65 to 85 vol % are included in the resin composition.

11. The heat radiation substrate of claim 10, wherein thermal conductivity is 18 W/mK or more.

12. The heat radiation substrate of claim 10, wherein peel strength is 0.8 kgf/cm or more.

13. A heat radiation substrate, which is formed of a resin composition including a resin and a surface-coated boron nitride agglomerate, wherein, when a predetermined pressure is applied to a square-column-shaped specimen prepared from the heat radiation substrate and having a height of 127 mm, a width of 3.2 mm, and a length of 12.7 mm or a square-column-shaped specimen prepared from the heat radiation substrate and having a height of 80±2 mm, a width of 4±0.2 mm, and a length of 10±0.2 mm at a rate of 10 mm/min to break the specimen into a first portion and a second portion, both fracture surfaces of the first portion and the second portion include a piece of the surface-coated boron nitride agglomerate, wherein a coating layer of the boron nitride agglomerate comprises a polymer having the following unit:

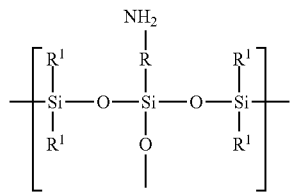

wherein R is selected from the group consisting of an alkylene group having 1 to 3 carbon atoms, an alkenylene group having 2 to 3 carbon atoms, and an alkynylene group having 2 to 3 carbon atoms, and wherein $R^1$ is selected from the group consisting of an alkyl group having 1 to 3 carbon atoms, an alkene group having 2 to 3 carbon atoms, and an alkyne group having 2 to 3 carbon atoms.

14. The heat radiation substrate of claim 13, wherein a diameter of the piece of the boron nitride agglomerate is 30% or more of an average diameter of the boron nitride agglomerate.

15. The heat radiation substrate of claim 13, wherein the piece of the boron nitride agglomerate is formed on corresponding positions of the fracture surfaces of the first portion and the second portion.

16. A resin composition comprising:
a resin; and
an inorganic filler including a boron nitride agglomerate,
wherein a coating layer including a —Si—R—NH$_2$ group is formed on the boron nitride agglomerate, and R is selected from the group consisting of an alkylene group having 1 to 3 carbon atoms, an alkenylene group having 2 to 3 carbon atoms, and an alkynylene group having 2 to 3 carbon atoms, and wherein the resin is an epoxy-based resin, the inorganic filler further includes aluminum oxide, and the epoxy-based resin at 15 to 35 vol %, and the inorganic filler at 65 to 85 vol % are included in the resin composition.

17. A heat radiation substrate comprising:
a resin composition which includes a resin, and an inorganic filler including a boron nitride agglomerate,
wherein a coating layer including a —Si—R—NH$_2$ group is formed on the boron nitride agglomerate, and R is selected from the group consisting of an alkylene group having 1 to 3 carbon atoms, an alkenylene group having 2 to 3 carbon atoms, and an alkynylene group having 2 to 3 carbon atoms, wherein the resin is an epoxy-based resin, the inorganic filler further includes aluminum oxide, and the epoxy-based resin at 15 to 35 vol %, and the inorganic filler at 65 to 85 vol % are included in the resin composition.

* * * * *